(12) United States Patent
Sato

(10) Patent No.: US 6,306,765 B1
(45) Date of Patent: Oct. 23, 2001

(54) METHOD FOR THE FORMATION OF THIN FILMS FOR USE AS A SEMICONDUCTOR DEVICE

(75) Inventor: Junichi Sato, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 08/283,253

(22) Filed: Jul. 29, 1994

Related U.S. Application Data

(63) Continuation of application No. 07/963,625, filed on Oct. 20, 1992, now abandoned.

(30) Foreign Application Priority Data

Oct. 21, 1991 (JP) ................................................ P3-301028

(51) Int. Cl.[7] .......................... C23C 16/00; H01L 21/44; H01L 1/02
(52) U.S. Cl. .......................... 438/680; 438/637; 438/685; 427/97; 427/255.28; 427/255.391; 427/255.392; 427/255.15; 427/571; 427/575; 427/576
(58) Field of Search ................................ 427/250, 255.1, 427/255.3, 253.7, 569, 570, 576, 585, 587, 124, 126.3, 97, 571, 575, 255.15, 255.17, 255.19, 255.28, 253.391, 255.392; 118/723, 723 MR, 719; 438/637, 630, 685

(56) References Cited

U.S. PATENT DOCUMENTS

| | | | |
|---|---|---|---|
| 4,337,300 | * | 6/1982 | Itaba et al. ............................. 427/250 |
| 4,461,799 | * | 7/1984 | Gaurilov et al. ...................... 427/569 |
| 4,732,761 | * | 3/1988 | Machida et al. ...................... 437/228 |
| 4,891,118 | * | 1/1990 | Ooiwa et al. ......................... 204/298 |
| 4,923,715 | * | 5/1990 | Matsuda et al. ...................... 427/237 |
| 4,943,450 | * | 7/1990 | Sarin .................................. 427/255.7 |
| 5,039,548 | * | 8/1991 | Hirose et al. ........................ 427/45.1 |
| 5,099,790 | * | 3/1992 | Kawakami ............................ 118/723 |
| 5,173,327 | * | 12/1992 | Sandhu et al. ..................... 427/255.1 |
| 5,192,589 | * | 3/1993 | Sandhu ............................. 427/255.1 |
| 5,203,959 | * | 4/1993 | Hirose et al. ......................... 156/643 |
| 5,240,879 | * | 8/1993 | De Bruin ............................. 437/190 |
| 5,342,806 | * | 8/1994 | Asahina ............................... 437/195 |
| 5,393,565 | * | 2/1995 | Suzuki et al. ..................... 427/255.2 |
| 5,427,827 | * | 6/1995 | Shing et al. .......................... 427/577 |

OTHER PUBLICATIONS

Kumar et al. "Growth & Properties of TiN and $TiO_xN_y$, Diffusion Barrier in Silicon on Sapphire Integrated Circuits", Thin Solid Films, 153(1987), pp. 287–301.*
CRC Handbook of Chemistry and Physics, Editor Robert C. Weast 1969–1970 $50^{th}$ Edition, p. B135.*
Hackhis Chemical Dictionary (Fourth Edition), Editor Julius Grant, Sep. 13, 1977, p. 462.*
Thin Solid Films, 153 (1987) pp. 287–301.*

* cited by examiner

*Primary Examiner*—Brian K. Talbot
(74) *Attorney, Agent, or Firm*—Sonnenschein Nath & Rosenthal

(57) ABSTRACT

A film formation method which comprises the steps of forming a high melting metal film on a substrate to cover an insulating pattern formed on the substrate therewith, and forming on the surface of the high melting metal film a high melting metal nitride film or a high melting oxide nitride film. The high melting metal film in the first step is formed by a chemical vapor deposition process, after which the high melting metal nitride or high melting metal oxide nitride film is continuously formed by the chemical vapor deposition process. During the CVD processes in the first and second steps, the substrate may be applied with an RF bias.

19 Claims, 5 Drawing Sheets

METHOD FOR THE FORMATION OF THIN FILMS FOR USE AS A SEMICONDUCTOR DEVICE

This is a continuation of application Ser. No. 07/963,625, filed Oct. 20, 1992, now abandoned.

BACKGROUND OF THE INVENTION

1. Field of the Invention

This invention relates to a method for forming thin films which are used in semiconductor devices.

2. Description of the Prior Art

A titanium nitride (TiN) or titanium oxide nitride (TiON) film has been used as a layer, for example, for intimately contacting a substrate of a semiconductor device and an electrode therewith.

For contacting the substrate and the electrode, there are known techniques wherein a plug is formed in a contact hole. One such technique is a burying technique using so-called blanket tungsten (hereinafter abbreviated as BLK-W).

This burying technique is described with reference to the FIGS. 5(A) to 5(C) which illustrate the formation process.

As is particularly shown in FIG. 5(A), a diffusion layer 62 is formed in a semiconductor substrate 61 (made, for example, of monocrystal silicon). Thereafter, an insulating film 63 is formed on the semiconductor substrate 61. The insulating film 63 at its portion which has been formed on the diffusion layer 62 is provided with a contact hole 64 as shown.

As shown in FIG. 5(B), a contact layer 65 made, for example, of TiN is formed according to a chemical vapor deposition (CVD) process in such a way that inner walls of the contact hole 64 and the upper surface of the insulating film 63 are covered with the contact layer 65.

Finally, as shown in FIG. 5(C), a BLK-W film 66 is formed on the inside of the contact hole 64 and on the contact layer 65, for example, according to the CVD process.

If a tungsten (W) plug (not shown) is formed, the BLK-W film 66 is etched back, thereby leaving the BLK-W film 66 in the inside of the contact hole 64 to form a tungsten plug.

However, a disadvantage with the burying technique using the BLK-W is that if the contact hole 64 is not fully covered with the contact layer 65, there will be produced a void 67 (see FIG. 6) in the BLK-W film 66 which has been formed according to the CVD process.

Moreover, where titanium chloride (TiCl$_4$) is employed as a source for the formation of a TiN film as the contact layer 65 according to the CVD process, chlorine (Cl) may be included in the thus formed contact layer 65. This will degrade the contact layer and lower its barrier property. In addition, the TiN film causes the contact resistance between the bottom of the contact hole 64 and the diffusion layer 62 to be undesirably increased.

Alternatively, if a titanium oxide nitride (TiON) film is formed as the contact layer 65 according to the CVD process, the problem of the chlorine inclusion in the contact layer 65 is solved but another problem of increasing the contact resistance is left unresolved. Thus, the contact resistance is undesirably increased in either case.

To avoid the above problem, it is usual to first form a titanium (Ti) film by sputtering and then a TiON film according to the CVD process. By this, the contact resistance is reduced with an improved barrier property. Since, however, the Ti film is formed by sputtering and the TiON film is formed by the CVD process, the throughput is considerably lowered.

SUMMARY OF THE INVENTION

It is accordingly an object of the invention to provide a method for forming thin films which has a low contact resistance and good film properties with a good throughput.

The above object can be achieved, according to one embodiment of the invention, by a thin film formation method which comprises:

the first step of forming a high melting metal film on a substrate to cover an insulating pattern formed on the substrate therewith; and the second step of forming on the surface of the high melting metal film a high melting metal oxide nitride film which consists of a compound of the high melting metal used to form the high melting metal film, oxygen and nitrogen, the high melting metal film in the first step being formed by a chemical vapor deposition process, after which the high melting metal oxide nitride film is continuously formed by the chemical vapor deposition process.

According to another embodiment of the invention, there is also provided a film formation method which comprises:

the first step of forming a high melting metal film on a substrate to cover an insulating pattern formed on the substrate therewith; and the second step of forming on the surface of the high melting metal film a high melting metal nitride film which consists of a compound of the high melting metal used to form the high melting metal film and nitrogen, the high melting metal film in the first step being formed by a chemical vapor deposition process, after which the high melting metal nitride film is continuously formed by the chemical vapor deposition process.

Preferably, the chemical vapor deposition process in the first and second steps of both embodiments is effected while applying an RF bias to the substrate.

In the thin film formation methods of both embodiments, the high melting metal film is first formed according to the CVD process and then a high melting metal oxide nitride film or high melting metal nitride film is formed on the metal film according to the CVD process. By this, the throughput is significantly improved. In addition, the formation of the high melting-metal film results in the reduction of contact resistance with the substrate. The formation of the high melting metal oxide nitride film or the high melting metal nitride film improves the barrier property against the substrate.

When the CVD process in the first and second steps is effected under application of an RF bias, the step coverage of the high melting metal film is increased along with an increase in the step coverage of the high melting metal oxide nitride film or high melting metal nitride film.

BRIEF DESCRIPTION OF THE DRAWINGS

FIG. 1C being after application of a second metal film;

DETAILED DESCRIPTION AND EMBODIMENTS OF THE INVENTION

Figure 1A:
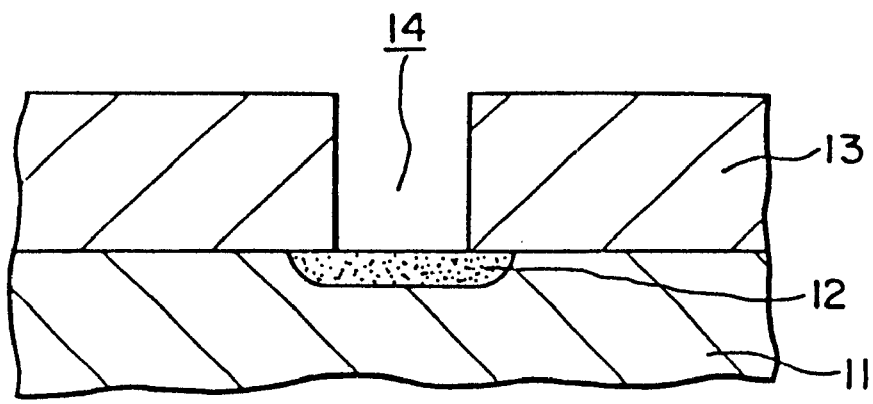
FIGS. 1A, 1B, and 1C are, respectively, schematic cross-sectional views showing a sequence of thin film formation steps according to one embodiment of the invention with FIG. 1A showing the substrate and film prior to applying any metal layer or film, FIG. 1B being after the application of a first metal film.
Figure 1B:
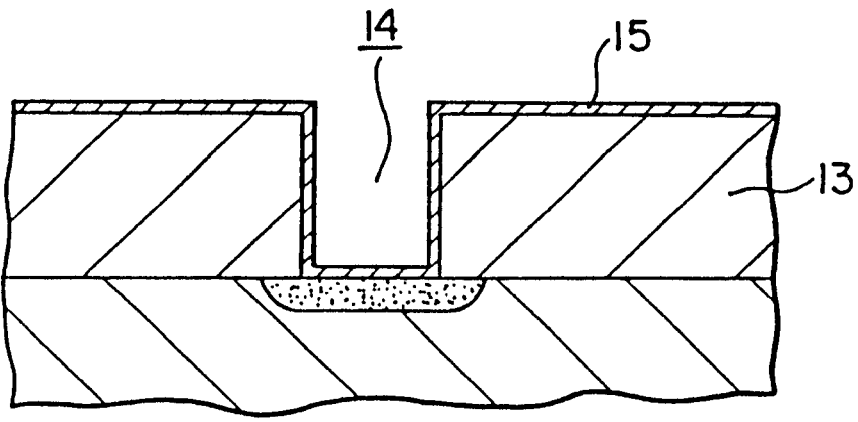
Figure 1C:
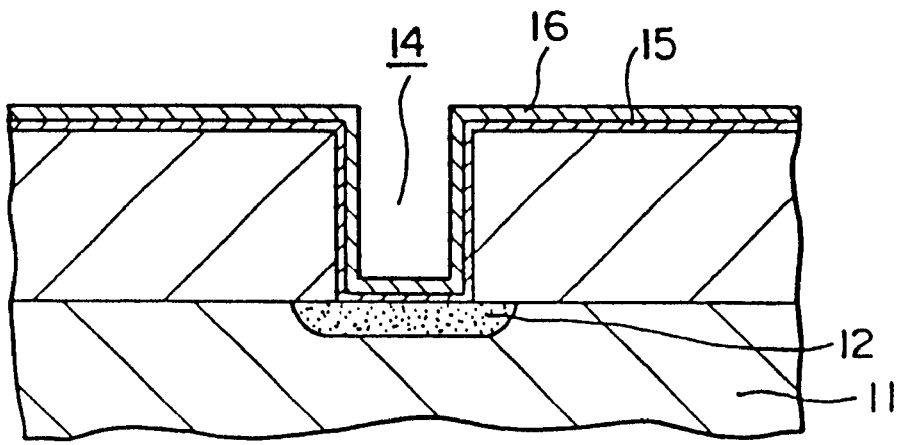
Figure 2:
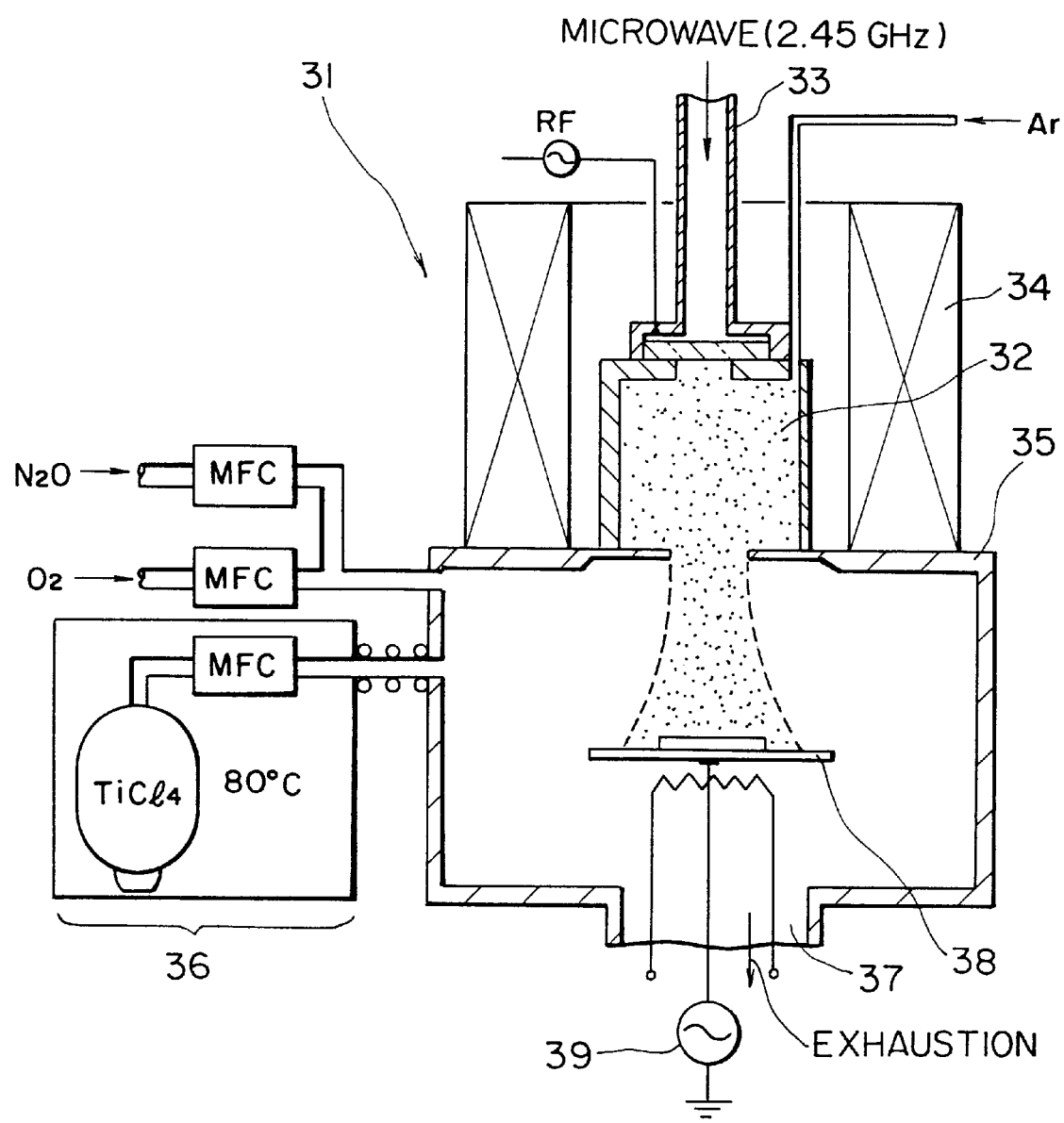
FIG. 2 is a schematic view of a chemical vapor deposition apparatus used in one embodiment of the invention.

Reference is now made to the accompanying drawings and particularly, to FIGS. 1 and 2 to illustrate one embodiment of the invention.

In FIG. 1, formation of a blanket tungsten (BLK-W) film as a contact layer is illustrate.

As shown in FIG. 1(A), a substrate 11 made, for example, of monocrystal silicon is provided, and a diffusion layer 12 which is incorporated, for example, with a conductive impurity is formed in the upper surface of the substrate as shown. An insulating film 13 is formed on the upper surface of the substrate 11. The insulating film 13 is provided, as an insulating film pattern, with a contact hole 14, for example, extending to the diffusion layer 12.

As shown in FIG. 1(B), a high melting metal film 15 such as, for example, a titanium film, is formed in a thickness, for example, of 30 nm according to a CVD process using an ECR (electron cyclone resonance)-CVD (chemical vapor deposition) apparatus 31 (see FIG. 2) in the first step of the method of the invention. The formation is effected such that the high melting metal film covers the inners walls of the contact hole 14 and the surface of the insulating film 13. In this CVD process, an RF bias is applied to the substrate 11 during the formation.

Typical film-forming conditions for the Ti film are described.

Titanium tetrachloride ($TiCl_4$) is provided as a reactant gas and argon (Ar) is used as an excitation gas. The flow rate of $TiCl_4$ is set at 50 sccm and the flow rate of Ar is at 50 sccm. The reaction conditions set are those including a temperature of not higher than 400° C., a pressure of 1.33 Pa, a microwave (2.45 GHz) output of 2.9 kW and an RF bias output of 300 W.

FIG. 2 shows a CVD apparatus 31 which includes a plasma chamber 32 generating a plasma, a microwave guide 33 connected to the plasma chamber 32 at the upper side thereof, an electromagnetic coil 34 provided around the plasma chamber 32, a reaction chamber 35 connected to the plasma chamber 32 at the lower side thereof, a gas feed unit 36 connected to the reaction chamber 35, an exhaust port 37 extending from the lower side of the reaction chamber 35, a stage provided within the reaction chamber 35, and an RF bias applicator unit 39 connected to the stage 38.

Then, as shown in FIG. 1(C), the second step is effected according to the CVD process using the ECR-CVD apparatus wherein an RF bias is applied like the above step, a high melting metal oxide nitride (e.g. titanium oxide nitride (TiON) film 16 which consists of titanium (Ti) used to form the Ti film 15, oxygen (O) and nitrogen (N) is formed on the Ti film 15.

The formation of the TiON film 16 is carried out using the ECR-CVD apparatus used to form the Ti film 15. After the formation of the Ti film 15, the gas used to form the Ti film 15 is exhausted from the reaction chamber substantially to vacuum. Subsequently, reaction gases for the TiON film 16 are introduced into the reaction chamber.

Typical film formation conditions for the TiON film 16 are described.

Reaction gases used include titanium tetrachloride ($TiCl_4$), dinitrogen monoxide ($N_2O$), and oxygen ($O_2$), and argon (Ar) is used as an excitation gas. $TiCl_4$ is bubbled at 80° C. and its flow rate is set at 10 sccm. The flow rate is set at 30 sccm for $N_2O$, at 30 sccm for $O_2$ and 50 sccm for Ar. The reaction conditions include a temperature of the reaction atmosphere of not higher than 400° C., a pressure of 1.33 Pa, a microwave output of 2.8 kW and an RF bias output of 300 W.

When the film is formed under conditions indicated above, Cl in $TiCl_4$ is converted to highly volatile titanium oxide chloride ($TiO_xCl_y$) and discharged to outside of the reaction chamber 35 (see FIG. 2). As a result, the TiON film 16 contains little chlorine, thus leading to an improvement of the quality of the TiON film 16.

Since an RF bias is applied during the film formation, the TiON film 16 becomes dense with an improved barrier property.

It will be noted that titanium tetrachloride ($TiCl_4$) and dinitrogen monoxide ($N_2O$) may be used as reaction gases along with an excitation argon gas. In this case, the flow rate is set at 10 sccm for $TiCl_4$, at 60 sccm for $N_2O$ and at 50 sccm for Ar. Other film-forming conditions are those indicated hereinbefore.

Alternatively, titanium tetrabromide or organometalic titanium may be used instead of $TiCl_4$. Likewise, other nitrogen oxide gases may be used instead of $N_2O$.

The flow rates of the gases should not be construed as a limitation but may be properly determined. It has been experimentally confirmed that the ratio of $N_2O+O_2$ or $N_2O$ to $TiCl_4$ is in the range of from 1 to 2:1 by mole.

In the above second step, the TiON film 16 has been formed. Instead, other high melting metal nitride film such as a TiN film consisting of a compound of high melting titanium and nitrogen may be formed.

The high melting metals include, aside from titanium, tungsten (W), molybdenum (Mo), hafnium (Hf), zirconium (Zr) or the like.

As set forth hereinabove, the high melting metal film 15 is directly contacted with the diffusion layer 12 of the semiconductor substrate, so that the contact resistance of the high melting metal film 15 with the diffusion layer 12 becomes small.

Since the Ti film 15 and the TiON film 16 are continuously formed, the throughput is improved.

Where the BLK-W film 17 is formed as stated above, the TiON film 16 which serves as a contact layer for the BLK-W film is formed in a uniform thickness over the entire surfaces including the surfaces of the contact hole 14. Accordingly, the BLK-W film 17 does not involve any void in the contact hole 14.

Figure 4:
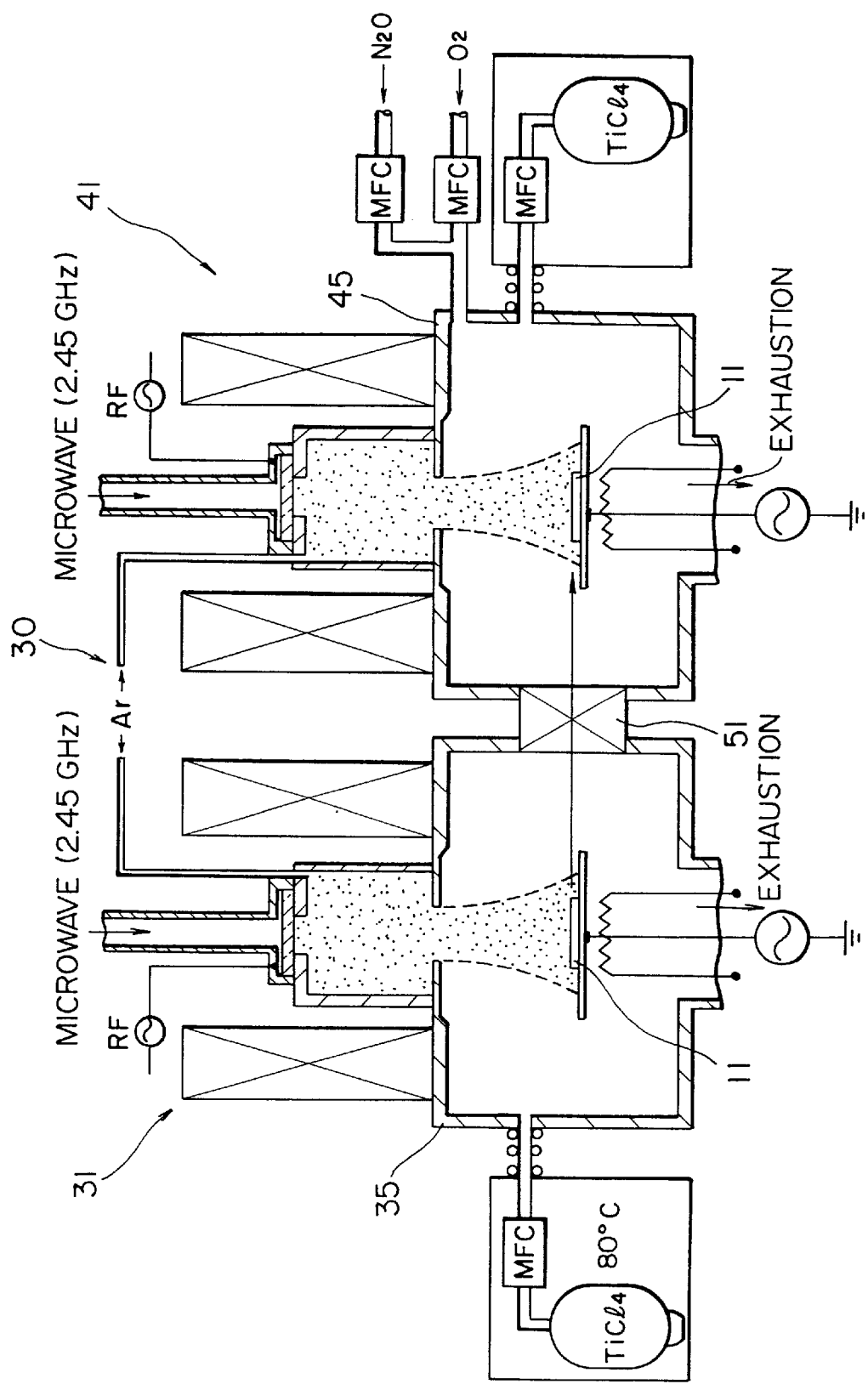
FIG. 4 is a schematic view of a chemical vapor deposition apparatus used in another embodiment of the invention.
Figure 5A:
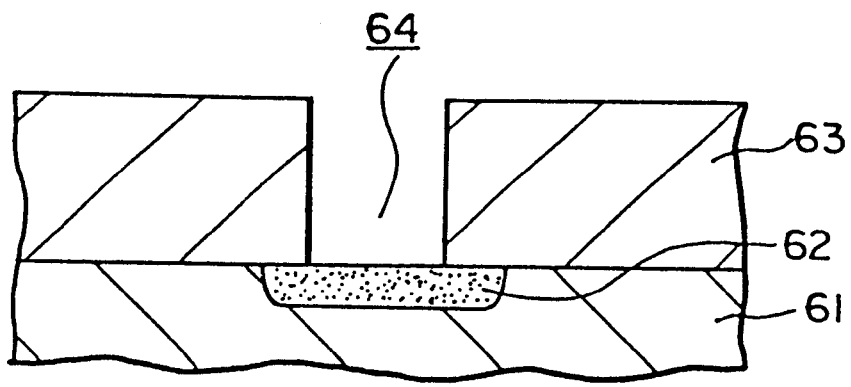
FIGS. 5A, 5B and 5C are, respectively, schematic cross-sectional views showing a known burying technique with FIG. 5A being before applying a metal film on the contact hole and substrate, FIG. 5B being after applying the metal film and FIG. 5C being after filling the contact hole.
Figure 5B:
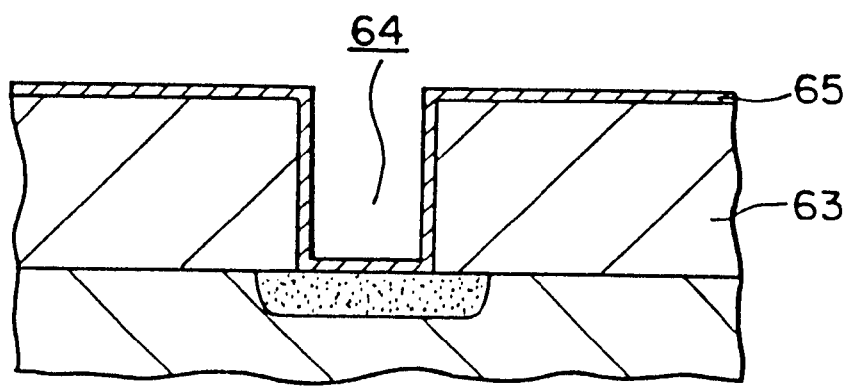
Figure 5C:
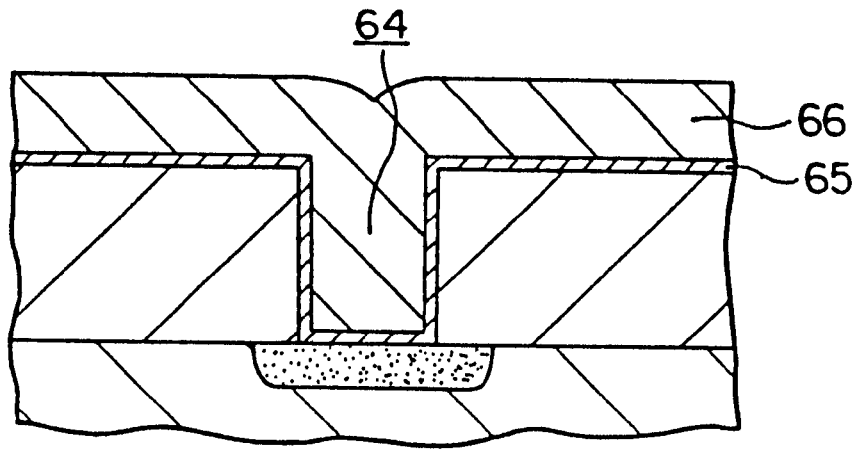

The continuous film formation method of the Ti film 15 and the TiON film 16 described hereinbefore may be effected by a CVD apparatus shown in FIG. 4. This film formation is set forth using FIGS. 1 and 4.

As shown in FIG. 4, a CVD apparatus 30 includes first and second CVD devices 31, 41 (e.g. ECR-CVD devices capable of being applied with an RF bias ) whose reaction chambers 35, 45 are connected through a gate valve 51. The first and second CVD apparatus 31, 41 are substantially the same as the CVD apparatus set out in FIG. 2 and are not described herein.

In the first step, a high melting metal film 15 (e.g. a Ti film) is formed as shown in FIG. 1(B). The film-forming conditions are the same as those described hereinbefore.

The semiconductor substrate 11 processed in the reaction chamber 35 of the first CVD apparatus 31 is transferred to the reaction chamber 45 of the second CVD.

In addition, the chemical vapor deposition process is effected while applying an RF bias thereby forming the Ti film 15 and the TiON film 16. Thus, the step coverage of the Ti film 15 and the TiON film 16 is increased.

Figure 3:
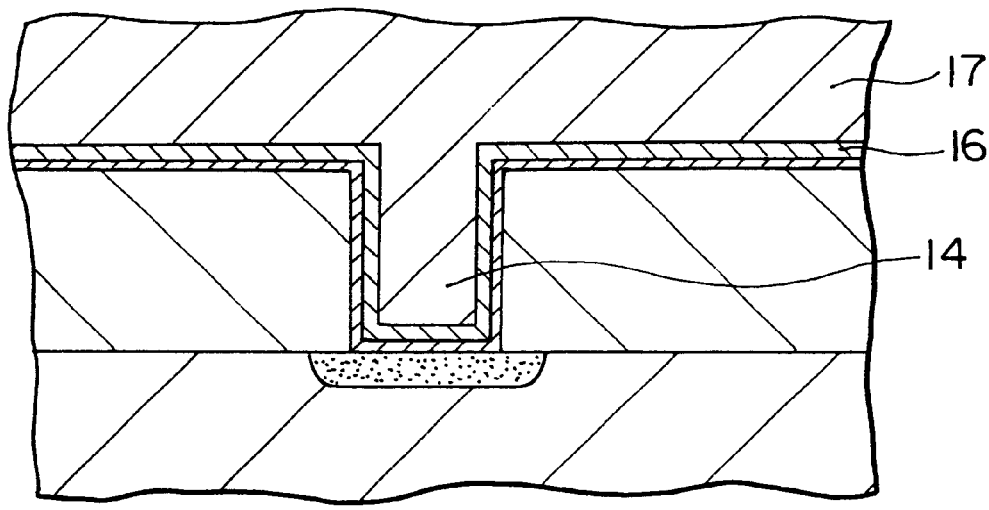
FIG. 3 is a schematic cross-sectional view of illustrating formation of a blanket tungsten film.
Figure 6:
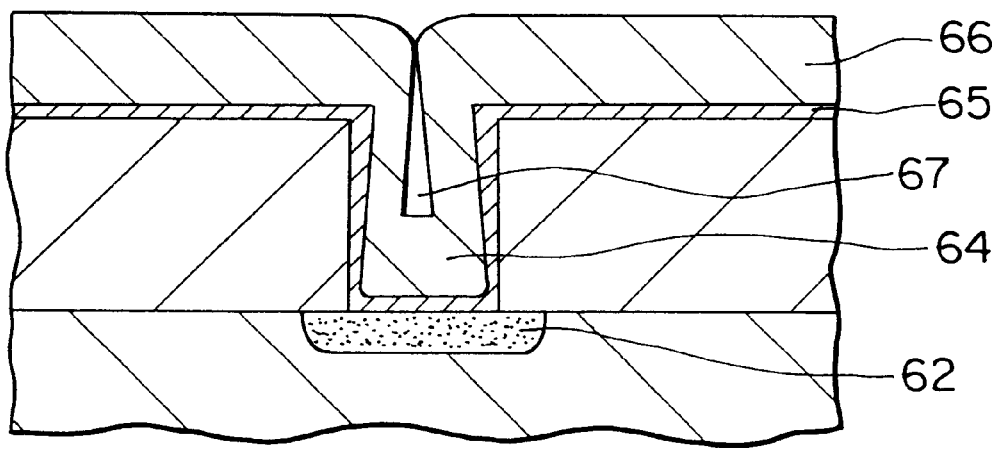
FIG. 6 is a schematic view showing a defect in a blanket tungsten film obtained by the known technique.

Thereafter, as shown in FIG. 3, a blanket tungsten (BLK-W) film 17 is formed, as a plug formation layer, on the surface of the TiON film 16 according to an ordinary CVD process. The BLK-W film 17 is conducted by an ordinary two-stage film-forming procedure.

In the first stage, 25 sccm of tungsten hexafluoride ($WF_6$) and 10 sccm of monosilane ($SiH_4$) are used as the reaction gases. The pressure of the reaction atmosphere is set, for example, at 10.6 kPa and the temperature is set at 475° C. Under these conditions, the first stage film formation is effected.

A second-stage film formation is subsequently effected. The film-forming conditions of the second stage include, for example, a flow rate of 60 sccm for tungsten hexafluoride ($WF_6$) and a flow rate of 360 sccm for hydrogen ($H_2$). The pressure and temperature of the reaction atmosphere are the same as those used in the first stage. apparatus 41 through the gate valve 51. In the second step, a high melting metal oxide nitride film 16 (e.g. a TiON film) is formed on the Ti film 15 as shown in FIG. 1(C). The film-forming conditions are those set out with respect to FIG. 2.

As set forth herein above, after the formation of the Ti film 15 in the reaction chamber 35, the semiconductor substrate 11 on which the Ti film has been formed is transferred within the reaction chamber 45 without exposure to air. In the chamber 35, the TiON film 16 is formed, so that any natural oxide film is not formed on the Ti film 15. Thus, the TiON film 16 can be formed on the surface of the clean Ti film 15. Consequently, the TiON film 16 has a good quality and a good barrier property.

The films are continuously formed in the reaction chambers 35, 45, respectively, resulting in an improvement of the throughput.

In the above embodiments, the formation of the TiON film 16 in the second stage has been described. The TiON film may be substituted with a TiN film in the same manner as described hereinbefore, except that titanium tetrachloride ($TiCl_4$) and nitrogen (N) are used as reaction gases and argon is used as an excitation gas. The reaction conditions are similar to those for the formation of the TiON film 16.

As will be apparent from the foregoing, a high melting metal film which is used to reduce the contact resistance with a semiconductor substrate and a high melting metal nitride film or a high melting metal oxide nitride film which ensures a high barrier property against the substrate can be continuously formed by similar chemical vapor deposition processes. Thus, the throughput is significantly improved. Moreover, since the film formation is effected according to the chemical vapor deposition process while applying an RF bias, the high melting metal film and the high melting metal oxide nitride or high melting metal nitride can be formed uniform in thickness. This results in an improved step coverage.

What is claimed is:

1. A method of manufacturing a semiconductor device comprising the steps of providing a semiconductor substrate having a patterned insulating layer formed on a surface thereof, the insulating layer being patterned to form at least one contact hole defining side walls of said insulating layer and an exposed portion of the surface of said semiconductor substrate; forming a first film by a first chemical vapor deposition to cover the patterned insulating layer, the side walls and the exposed portion, the first film being a pure metal selected from a group consisting of titanium, tungsten, molybdenum, hafnium, and zirconium; without exposing the first film to air, successively forming a second film by a second chemical vapor deposition on the first film, said second film being a metal oxynitride and the metal of the compound being the metal used to form the first film; and then forming a tungsten film on the second film to fill each contact hole with the tungsten film, said first and second chemical vapor depositions being performed using a gas consisting of a halogen and said metal.

2. A method according to claim 1, wherein the first film is a Ti film and said second film is a TiON film.

3. A method according to claim 1, wherein the step of forming the second film is by chemical vapor deposition using $TiCl_4$ and $N_2O+O_2$ or $N_2O$ at a ratio by mole of 1:1 to 2.

4. A method according to claim 1, wherein the first chemical vapor deposition and the second chemical vapor deposition are effected while applying an RF bias to said substrate.

5. A method according to claim 1, wherein each of the steps of forming the first and second films uses an electron cyclone resonance-chemical vaporization deposition using a gas containing $TiCl_4$.

6. A method according to claim 1, which includes providing a chemical vaporization device having a chamber, wherein both of said steps of forming the first film and forming the second film being performed in said chamber.

7. A method according to claim 1, which includes providing a chemical vaporization device having a first chamber connected by a gate valve to a second chamber, said step of forming the first film being performed in the first chamber and said step of forming the second film being performed in the second chamber.

8. A method according to claim 1, wherein the halogen is chlorine.

9. A method of manufacturing a semiconductor device comprising the steps of providing a semiconductor substrate having a patterned insulating layer on a surface thereof, said insulating layer having at least one contact hole with side walls to expose a selected portion of the surface of the semiconductor substrate; depositing a first film by a first chemical vapor deposition to cover the insulating layer, the side walls of the contact hole and the exposed selected portion of the surface of the semiconductor substrate, said first film being a metal film with the metal selected from a group consisting of titanium, tungsten, molybdenum, hafnium, and zirconium; without exposing the first film to air, successively subjecting the first film to a second chemical vapor deposition to form a second film on the first film, said second film being selected from a group consisting of a metal nitride film and a metal oxynitride film and the second film using the metal used to form the first film; and forming a tungsten film on the second film to fill each contact hole with the tungsten film, said first and second chemical vapor depositions being performed using a gas consisting of a halogen and said metal.

10. A method according to claim 9, wherein the first film is a titanium film and the second film is a TiN film.

11. A method according to claim 9, wherein first and second the chemical vapor depositions are effected while applying an RF bias to said substrate.

12. A method according to claim 9, wherein the steps of forming both the first and second films uses an electron cyclone resonance-chemical vaporization deposition using a gas containing $TiCl_4$.

13. A method according to claim 9, which includes providing a chemical vaporization device having a single chamber, wherein both of said steps of forming the first film and forming the second film being performed in said chamber.

14. A method according to claim 9, which includes providing a chemical vaporization device having a first chamber connected by a gate valve to a second chamber, said step of forming the first film being performed in said first chamber and said step of forming the second film being performed in the second chamber.

15. A method according to claim 9, wherein the halogen is chlorine.

16. A method of manufacturing a semiconductor device comprising the steps of providing a chemical vaporization device having a first chamber connected by a gate valve to a second chamber; providing a semiconductor substrate having a patterned insulating layer on a surface thereof, said insulating layer having at least one contact hole with side walls to expose a selected portion of the surface of the semiconductor substrate; inserting the substrate in the first chamber and depositing a first film by a first chemical vapor deposition to cover the insulating layer, the side walls of the contact hole and the exposed selected portion of the surface of the semiconductor substrate, said first film being a metal film with the metal selected from a group consisting of titanium, tungsten, molybdenum, hafnium, and zirconium; transferring the substrate through the gate valve to the second chamber without exposing the first film to air; while in the second chamber, successively subjecting the first film to a second chemical vapor deposition to form a second film on the first film, said second film being selected from a group consisting of a metal nitride film and a metal oxynitride film and the second film using the metal used to form the first film; and forming a tungsten film on the second film to fill each contact hole with the tungsten film, said first and second chemical vapor depositions being performed using a gas consisting of a halogen and said metal.

17. A method according to claim 16, wherein the metal is titanium and the halogen is chlorine.

18. A method according to claim 16, wherein the first and second chemical vapor depositions are effected while applying an RF bias to the substrate.

19. A method according to claim 16, wherein the first and second chemical vapor depositions are electron resonance-chemical vaporization depositions using a gas containing $TiCl_4$.

* * * * *